United States Patent [19]
Fazio et al.

[11] Patent Number: 4,791,578
[45] Date of Patent: Dec. 13, 1988

[54] LOGIC GATE SYSTEM DESIGN

[75] Inventors: Dennis Fazio, Minneapolis; Thomas J. Harris, Shoreview, both of Minn.

[73] Assignee: ETA Systems, Inc., St. Paul, Minn.

[21] Appl. No.: 947,612

[22] Filed: Dec. 30, 1986

[51] Int. Cl.$^4$ .................... G06F 15/60; G06F 11/00
[52] U.S. Cl. .................................. 364/488; 307/445; 364/554; 371/23
[58] Field of Search .............................. 364/488–491, 364/554, 578; 307/440, 445; 371/23

[56] References Cited
U.S. PATENT DOCUMENTS

| 4,527,249 | 7/1985 | Van Brunt | 364/578 |
| 4,587,625 | 5/1986 | Marino Jr. et al. | 364/578 |
| 4,590,581 | 5/1986 | Widdoes, Jr. | 364/578 |
| 4,644,487 | 2/1987 | Smith | 364/488 |
| 4,675,832 | 6/1987 | Robinson et al. | 364/488 |
| 4,694,411 | 9/1987 | Burrows | 364/578 |
| 4,697,241 | 9/1987 | Lavi | 364/488 |

OTHER PUBLICATIONS

Stefan: An Alternative to Fault Simulation, S. K. Jain, V. D. Agrawal, AT&T Bell Laboratories, Paper 2.3, IEEE 21st Design Automation Conference 1984.
Mixed-Level Fault Coverage Estimateion, H. K. Ma, A. L. Sangiovanni-Vincentelli, University of California Berkeley, Paper 32.3, IEEE 23rd Design Automation Conference 1986.

Primary Examiner—Parshotam S. Lall
Assistant Examiner—Kevin J. Teska
Attorney, Agent, or Firm—Kinney & Lange

[57] ABSTRACT

A method for evaluating the testability of circuit systems containing a plurality of logic gates through evaluating statistical properties in response to selected inputs.

12 Claims, 2 Drawing Sheets

LOGIC GATE SYSTEM DESIGN

BACKGROUND OF THE INVENTION

Field of the Invention

The present invention relates to the design of circuit systems comprising logic gates, and more particularly, to such systems, even though they are subject to component failures leading to erroneous logic values occurring therein, that they have a design such that those faults which occur can be successfully found by testing.

Circuit systems for performing complicated logic functions based on both combinational and sequential logic circuits continue to find wider usage. This is the result of many factors, but primary among them are decreasing costs of, and decreasing amounts of space being taken by (increases in packing density) such systems. As a result, it is possible to make many improvements, some bordering on revolutionary, in many manufactured articles and to provide new kinds of items not previously available.

Increasing logic circuit density is primarily the result of increasing logic gate density in monolithic integrated circuits, although significant advances have also been made in miniaturizing the housings used for such integrated circuits. Such increases in logic gate density in monolithic integrated circuits have gotten to the point where tens of thousands of gates can be provided in a single monolithic circuit chip, and chips with hundreds of thousands of gates are at hand. Such large numbers of logic gates in a single chip can lead to very significant testing problems because faults which can occur in any of thousands of gates must be observable at a relatively few output terminations on the chip, terminations numbering not more than a few hundred at most. A circuit system which is not carefully designed can lead to logic gate arrangements having faults occur therein which are simply not observed at all at chip terminals, or can only be observed after an uneconomic amount of testing is conducted on such chips.

Therefore, a technique is desired which can evaluate proposed circuit system designs to determine the testability thereof. One method is the use of computer simulation. This is based on representing in a computer system a proposed design where the computer can then be directed to supply various input logic values for the circuit system inputs and determine the logic values which would result on each of the logic gate outputs and the circuit system outputs. Fault-free simulation of the logical operation of the circuit without faults can then be used to verify that the proposed circuit system design will yield the proper logic values at the circuit system outputs for the logic values selected to be applied to the circuit system inputs.

There is also the further possibility of simulating faulty circuit systems. Each logic gate input can sequentially be assumed to be stuck at a zero value or, alternatively, at a one value and the circuit performance thereafter simulated to determine the effect of such a fault. However, for circuit systems having a large number of logic gates, the cost of such a simulation becomes prohibitive. An alternative is to simulate the performance based on a random subset of possible faults which can occur in the proposed design. This arrangement does not provide much information concerning possible faults for which the resulting effects were not simulated.

A further possibility is to use a statistical fault analysis approach which needs only a fault-free simulation for evaluation. Such an analysis is based on estimating the probabilities of a logic gate input taking a particular logic value and having an effect at the circuit system output. Whether this effect occurs depends on the various other inputs to the logic gate taking on values during tests which permit the logic gate input of interest, taking on such a logic value, to have an effect on one or more of the circuit system outputs. Such an analysis can provide a substantial indication of the testability of a proposed circuit design.

Therefore, a statistical analysis which can be used with any kind of logic gate connected in any kind of interconnection configuration would be very desirable if it did not increase costs of the computer simulations to uneconomic levels. Such a capability would permit evaluating integrated circuit chip designs prior to fabricating test or prototype chips, a provision which becomes quite expensive where the incorporated design is found to be substantially unusable.

SUMMARY OF THE INVENTION

The present invention provides a method for evaluating the testability of circuit systems containing a plurality of logic gates by representing such a circuit system in a computer system and applying successive randomly chosen sets of logic values to the circuit system inputs. Counters keep counts of certain logic values occurring at logic gate inputs and outputs as a basis for determining the likelihood of a logic gate taking a certain logic gate input value and of an indication of this occurrence appearing at one or more of the circuit system outputs. On this basis, the detection of faults occurring at each input line in the form of an incorrect value and being detected at a system output during testing can be estimated. Estimates showing the likelihood to be low of discovering faults forms a basis for proposing an altered, subsequent design for the circuit system which would provide improved testability.

DETAILED DESCRIPTION OF THE PREFERRED EMBODIMENTS

Proposed designs for circuit systems based on electrical interconnections of substantial numbers of logic gates are usually formulated in a computer system of one type or another because of the complexity of such large systems and because of the analysis capabilities of a computer with respect to such designs. The design is typically represented in the computer system by a "net list" or network listing showing the interconnections of the logic gates and one or more sets of equations defining models for the logic gates. Determining the testability of such a proposed design is a major part of the analysis and a significant factor leading to subsequent designs representing modifications of earlier designs to improve testability of the final design reached before it is implemented in the monolithic integrated circuit chip.

Figure 1:
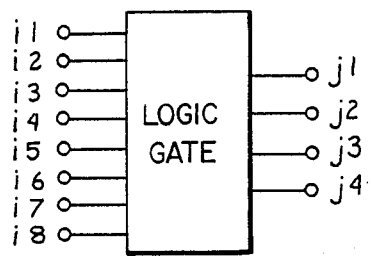
FIG. 1 shows a representation of a logic gate.

A representation typical for a logic gate, 10, is shown in FIG. 1. Logic gate 10 is shown as having eight inputs designated $i_1$ through $i_8$ and four outputs designated $j_1$ through $j_4$. Such a representation is sufficient to represent most logic gate circuits used through defining the Boolean algebraic equations to be followed by the logic gate circuit being represented insofar as relating the circuit outputs to the circuit inputs. Should a logic gate circuit have a greater number of inputs or outputs, the representation of FIG. 1 can be combined with another similar representation in such a manner as to provide a representation for such a circuit. For logic gate circuits having fewer inputs or fewer outputs, there will result in unused inputs or outputs, or both, in the representation of FIG. 1. The use of other kinds of logic circuit components in the circuit system, such as latches or storage registers, can be represented by combinations of logic gates in well known manners which can be represented by the representation of FIG. 1.

Figure 2:
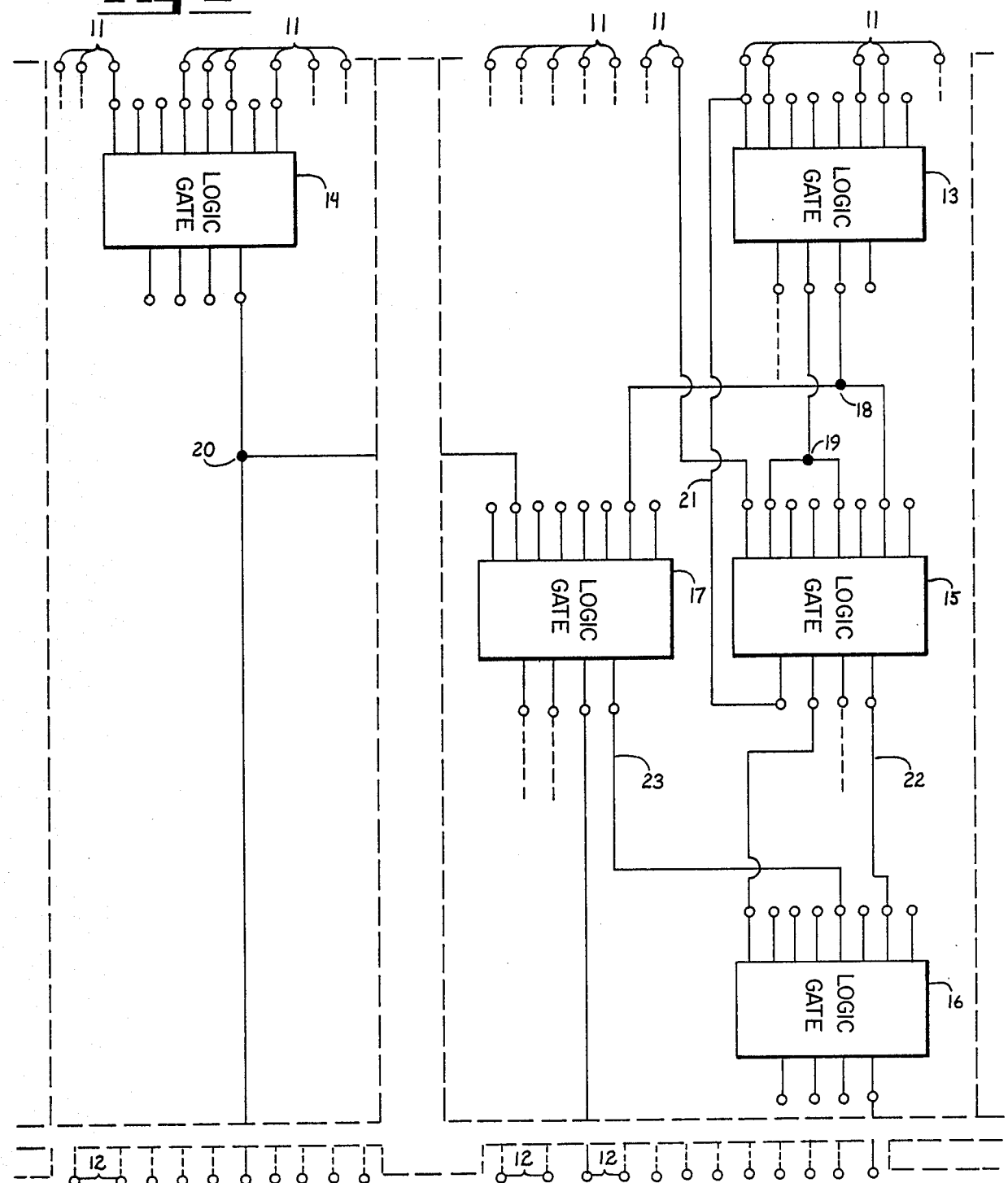
FIG. 2 shows a portion of a diagrammatic representation of a circuit system having such logic gates therein which are represented by the representation of FIG. 1.

FIG. 2 shows a circuit system having logic gates represented by the represention of FIG. 1, electrically interconnected to form this system which could represent either a proposed design or a final design. Some of the circuit system inputs, 11, have logic gates shown electrically connected thereto but connections to other system input terminals 11 are not shown in FIG. 2. Similarly, circuit system output terminals, 12, are presented without the actual interconnections to all of them being shown. However, a couple of solid line indications on either side of the dashed break lines show certain of the logic gates have outputs which go directly to circuit system output terminals 12.

Just small portions of the circuit system are shown, as is indicated by the long dashed break line enclosing those portions. Three different logic gates, 13, 14, and 15, are shown to be connected to system input terminals 11. Two remaining logic gates, 16 and 17, along with logic gate 14, are indicated to be connected to system output terminals 12 by the solid line leading from those terminals 12 to the dashed break lines portions opposite interconnection leads extending from these logic gates to the break lines.

Examples of some kinds of electrical interconnection arrangements are shown in FIG. 2. Thus, there are shown three "fan-out" branching connections, 18, 19 and 20.

Fan-out connection 18, leading from an output of logic gate 13 to one input of logic gate 15 and to another input of logic gate 17, leads to the possibility of the signal on connection 18 affecting itself further into the circuit system, as there can be a reconvergence of the signal paths through to further interconnections, 22 and 23. These electrical interconnections each occur at an output of a logic gate to which fan-out interconnection 18 leads. They are both made to a pair of inputs each common to logic gate 16 which could lead to one of the signals therealong affecting the other in logic gate 16.

A feedback electrical interconnection, 21, is shown between an output of logic gate 15 and an input of logic gate 13. Such an arrangement also leads to a signal affecting itself, as a point further into the circuit system receives this signal and provides it or a derivative thereof back to the source of the received signal. Such signals add difficulties to the analysis of the circuit system of FIG. 2 provided by the earlier mentioned computer on which it is represented.

Representing the circuit system shown in FIG. 2 in a computer system of a convenient type permits the performance of such a circuit system, or proposed design therefor, to be simulated by the computer in one manner or another. A typical arrangement is to use a Boolean evaluator kind of simulator which provides the resulting Boolean algebraic values at each logic gate output for a given set of logic values chosen for the circuit system inputs 11.

A simulation proceeds on the basis of the "net list" and the Boolean equations representing each logic gate. Evaluation of the resulting logic gate output logic values must proceed in the proper order so that those logic gate output logic values which depend on those occurring at another logic gate are determined after they have been determined for that other logic gate.

Logic gate output logic value results can be found for each of large numbers of differing sets of logic values provided for system inputs 11. If each of the logic values in each of the sets thereof applied to system inputs 11 are determined based on a random process, statistical sampling of the performance of the simulation model is possible to thereby provide a statistical description of the logic values and logic value combinations occurring at the various logic gate inputs and outputs. By keeping track of such logic values and logic value combinations in counters for repeated application of the differing sets of random logic values provided for system inputs 11, an estimate of the probabilities of these logic values and logic value combinations occurring at the various logic gate inputs and outputs in the simulated circuit system, and presumably in its physical embodiment, can be made.

For these results to be good estimates, there must be provided well chosen sets of logic values to be applied to system inputs 11. One method of providing good choices is to choose the logic sets randomly with a sufficient randomness. The computer system can, for instance, choose the sets on the basis of a random number generator of one type or another in well known manners.

Figure 3:
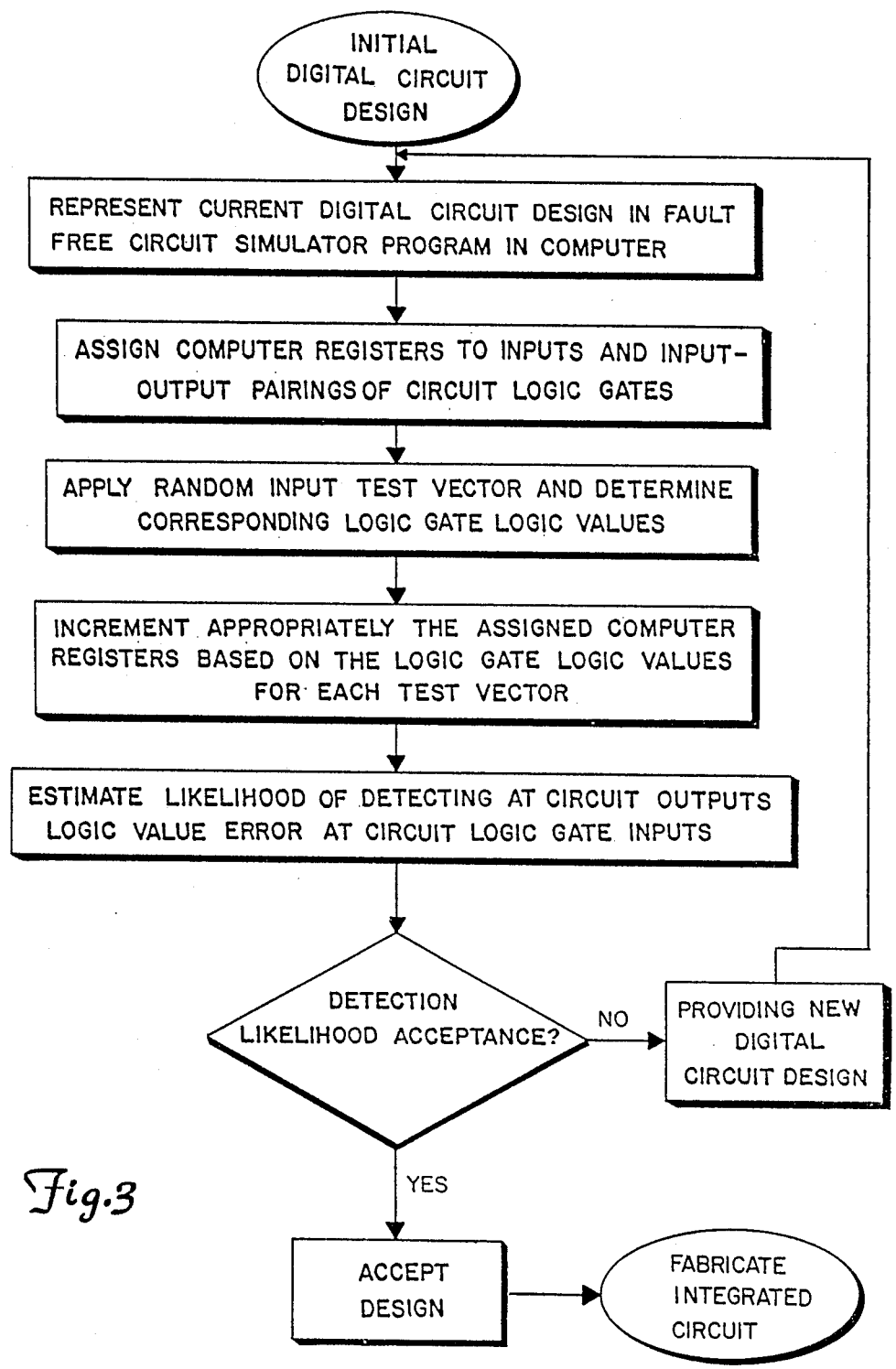
FIG. 3 shows a flowchart of the preferred method.

Such estimates of probability are needed for the present testability analysis following the flow chart of FIG. 3 as a basis for evaluating proposed circuit system designs potentially intended for implementation in monolithic integrated circuit chips through simulation after being represented in the computer. For this purpose, two kinds of counts will be kept and, therefore, count total registers or counters for each kind of count are provided in the same computer system which is to contain representations for proposed designs. Some of these registers will have the count totals kept in them appropriately incremented by the computer system at the end of such determination of logic values occurring at each logic gate output in response to each set of logic values provided for circuit system inputs 11 in the representation. Such incrementing will occur based on the determined output results found by the Boolean evaluator simulation program for each of such sets of system logic values.

Two registers for keeping count totals are designated for each logic gate representation input line in the proposed design representation of each circuit system design to be analyzed. One of the registers will keep a count of each of the times the logic value zero occurs on that corresponding gate input in response to a set of random logic values being applied to system inputs 11, and the other register corresponding to that input gate will keep a total of the responses in which a logic value of one appears at that logic gate input. If N sets of random logic values are sequentially provided for system inputs 11, and counts are kept in each of the two registers just described for each logic gate input of the logic values which appear at that input after the provision of each of these sets and the result determination therefor, the probability of a zero or of a one logic value occurring at such an input can be estimated by the count in the corresponding counter divided by N.

The underlying probabilities are designated as the zero-controllability and the one-controllability of gate input i where the zero-controllability is the probability of that input taking on a logic value of zero in response to a randomly selected set of logic values being applied to system inputs 11. Similarly, the one-controllability of input i is the probability of that line taking on a logic value of one in response to a randomly selected set of logic values applied to system inputs 11. Zero-controllability of logic gate input i will be represented herein by the symbol C0(i), and one-controllability of line i will be represented by the symbol C1(i). The estimates of these probabilities can be written as follows:

$$C0(i) = \frac{\text{Zero count register total for } i}{N}$$

$$C1(i) = \frac{\text{one count register total for } i}{N}$$

These registers will be termed controllability count registers.

The second kind of counts to be kept in registers in the computer system will be kept in sensitivity count registers. For each logic gate, each of the gate inputs, could, in general, be expected to affect each one of the gate outputs. Whether a change in logic value on an input i does actually affect an output j of the same logic gate depends on the logic values simultaneously present at the other gate inputs.

For instance, if the logic gate represented in FIG. 1 is a four input AND logic gate, thus having just one output in use along with the four inputs $i_1$ through $i_4$, input $i_1$ will be able to affect output j if inputs $i_2$ through $i_4$ all have a logic value of one thereat. Similarly, if the logic gate were a four input OR logic gate, input $i_1$ can affect the single output j if inputs $i_2$ through $i_4$ are all at a logic value of zero. In other words in these examples, input $i_1$ is sensitized to affect output j only by suitable logic values occurring at the remaining inputs. An alternative way of viewing sensitization is to say that input i is sensitized to output j if changing the logic value in input j, while holding the other input logic values as they are, would lead to a change in the logic value at output j.

For any particular pairing of an input i and an output j of the logic gate representation of FIG. 1, there can be but four possible logic value combinations for such pair if input i is sensitized to output j. These possibilities are:

$i = 0, j = 0$
$i = 0, j = 1$
$i = 1, j = 0$
$i = 1, j = 1$

A sensitivity count register will be provided for every such logic value combination for every gate input-gate output pairing possible in each logic gate. Thus, each logic gate would have associated with it a total of one hundred twenty-eight sensitivity count registers for the logic gate representation shown in FIG. 1 (assuming all inputs and outputs are used). Since there also being two controllability count registers for each input as indicated above, there will be a total of one hundred forty-four registers associated with each logic gate for recording responses at that logic gate to sets of random value logic values provided for system inputs 11.

The underlying probability to be estimated by the counts kept in the sensitivity count registers are (i) the 0-0 sensitivity of i to j which is the probability that gate input i will be sensitized to gate output j on any randomly selected set of logic values provided for system inputs 11 and that the resulting logic value on input i is zero and the resulting logic value on output j is zero, this probability being designated $S_{00}(i,j)$; (ii) the 0-1 sensitivity of i to j which is the probability that gate input i will be sensitized to gate output j on any randomly selected set of logic values provided for system inputs 11 and that the resulting logic value on input i is zero and the resulting logic value on output j is one, this probability being designated $S_{01}(i,j)$; (iii) the 1-0 sensitivity of i to j which is the probability that gate input i will be sensitized to gate output j on any randomly selected set of logic values provided for system inputs 11 and that the resulting logic value on input i is one and the resulting logic value on output j is zero, this probability being designated $S_{10}(i,j)$; and (iv) the 1-1 sensitivity of i to j which is the probability that gate input i will be sensitized to gate output j on any randomly selected set of logic values provided for system inputs 11 and that the resulting logic value on input i is one and the resulting logic value on output j is one, this probability being designated $S_{11}(i,j)$.

These probabilities will be estimated on the basis of count totals being kept in all of the sensitivity count registers from the determinations made for the logic gates in the system through simulation in response to N sets of randomly selected logic values being provided for system inputs 11. Each count register will be incremented by one count by the computer system when the gate input with which it is associated is sensitized to the gate output with which it is associated by pairing and its corresponding logic values appear on this gate input-gate output pair. The estimates of these probabilities can be written as follows:

$$S_{00}(i,j) = \frac{\text{0-0 sensitivity count register total for pairing } i,j}{N}$$

$$S_{01}(i,j) = \frac{\text{0-1 sensitivity count register total for pairing } i,j}{N}$$

$$S_{10}(i,j) = \frac{\text{1-0 sensitivity count register total for pairing } i,j}{N}$$

$$S_{11}(i,j) = \frac{\text{1-1 sensitivity count register total for pairing } i,j}{N}$$

For substantial circuit systems with relatively large numbers of system inputs and logic gates, the number of sets of randomly chosen logic values to be applied to the system inputs must be sufficiently large to provide an adequate number of samples for obtaining reasonably valid probability estimates based on these counters. A typical number of sets to be applied in sequence might be on the order of having N = 1000 to 4000 for a circuit system having 12,000 to 15,000 gates therein. N is to be chosen as large as possible, depending on the capabilities of the computer being used for these purposes. After such a sequence of randomly chosen logic value sets applied to inputs 11, the count totals kept in the controllability count registers and the sensitivity count registers divided by the value chosen for N will yield reasonably accurate probability estimates as a basis for further analysis to determine the likelihood of a logic gate input having a fault of either being stuck at a zero logic value or stuck at a one logic value being detected at one or more of circuit system outputs 12.

This further analysis begins at circuit system outputs 12 and assigns a probability, termed an observability, to each logic gate input and output of having a logic value occurring there affecting one or more of these system outputs. The first step is assigning the probability of 1.0 to each of these system outputs, the logic gate outputs from which they lead, and the interconnection pathways therebetween, as any logic value or any fault of the above stuck-at-zero or stuck-at-one nature on any of them would be immediately detectable by an observer looking at the results occurring on such an output. The analysis then continues by determining the probabilities of logic values occurring at each gate input of each logic gate in the circuit system (and therefore at the logic gate outputs from which they lead and the corresponding interconnection pathways) also being observable at system outputs 12. The zero-observability of line i is the probability of observing an effect at a system output 12 resulting from the logic value of line i becoming zero and will be written B0(i). Similarly, the one-observability of line i is the probability of observing or detecting at a system output 12 that the logic value taken by line i has become one and will be written B1(i).

The zero-observability of line i can be viewed as the conditional probability that any signal path from line i to a system output 12 has each logic gate therein sensitized along that path so that a logic value of zero occurring on gate input i can be detected if that logic value occurs. Since each logic gate output goes to another logic gate input or a system output 12, the zero-observability of such a logic gate input or system output 12 gives the probability of the signal path being sensitized to the occurrence of a logic value of zero on that gate input from the output of this logic gate to system 12 outputs. Thus, an iterative relationship to determine the observability of a particular input to a logic gate of interest can be based on (i) the observabilities of a system output or a logic gate input of a subsequent logic gate to which any logic gate of interest has an output connected, (ii) the sensitivities of the particular gate input of the logic gate of interest being sensitized to that logic gate input in the gate of interest which is connected to the just indicated input of the subsequent logic gate, combined with (iii) the controllabilities of the gate input of that logic gate to which the output is connected.

These logic gate of interest observabilities, giving the probability of the signal path being sensitized from the particular gate input of the logic gate of interest to system outputs 12, having been found in this manner permit, as a general matter, finding the observabilities of the next preceding logic gate. As a result, by assigning the probability values of 1.0 to each system output 12, the zero-observability and one-observability can be found for each gate input of a logic gate by iterating this procedure back through the circuit system based on (i) the observabilities previously found for inputs of other logic gates connected to the output of the logic gate currently being considered, and on (ii) the statistical data collected for this currently considered logic gate as kept in its corresponding controllability count registers and sensitivity count registers.

A particular logic value occurring on a gate input of any logic gate which is sensitized to an output of that logic gate can be reflected by either a zero logic value or a one logic value appearing on the sensitized gate output depending on the Boolean algebra equation defining the logic performance of the gate outputs with respect to the gate inputs. Thus, the observabilities of a gate input i of a given logic gate depend on both the zero-observability and the one-observability of the gate outputs of that logic gate (i.e., the zero- and one-observabilities of the inputs of subsequent gates to which they are connected) and the sensitization of gate input i to those outputs. This can be written for the zero-observability of any gate input i to one output j of its logic gate as:

$$B0(i,j) = \frac{S_{00}(i,j)[B0(j)] + S_{01}(i,j)[B1(j)]}{C0(i)}$$

This expression shows that the zero-observability of gate input i in the logic gate of interest sensitized to a single output of that logic gate depends on (i) the sensitivity for the paired input and output, i and j, when each has a logic value of zero times the zero-observability of the gate output as measured at its connection to the input of a subsequent gate, plus (ii) the sensitivity of that pair when the logic value of the input is zero and the logic value of the output is one times the one-observability of that gate output is indicated by its connection to a gate input in a subsequent logic gate, all (iii) divided by the zero-controllability of the logic gate input i to give the conditional probability of observing a one logic value occurring at that gate input, should it occur. Similarly, the one-observability of that gate input can be written as:

$$B1(i,j) = \frac{S_{10}(i,j)[B0(j)] + S_{11}(i,j)[B1(j)]}{C1(i)}$$

The observability of a gate input i may occur through more than one signal path to a system output 12 raising the probability of it being observable for a given logic value occurring thereon. This situation can occur within a logic gate since the gate may have more than one output. Thus, a combining of the probabilities found for the signal path being sensitized from a gate input through each particular gate output to system outputs 12 must be made to account for the multiplicity of gate outputs in a logic gate. The various gate outputs can be viewed as a "fan-out" circuit arrangement with respect to the gate input of interest. Just how the probabilities of observations from various outputs with respect to input i should be combined depends on the degree of reconversions between the signal paths leading from each output to system outputs 12.

This can be seen from an explicit fan-out situation, such as shown in FIG. 2 at 18 or 19, where the observability of either of the outputs leading from logic gate 13 can be viewed at either of the inputs of logic gate 15 and logic gate 17 for fan-out connection 18 or at either of the inputs to logic gate 15 for fan-out connection 19. Considering fan-out connection 19 as an example, since the observability of the corresponding output from logic gate 13 can be through either of the inputs of logic gate 15, the observability of the output at gate 13 must be greater than or equal to the observability of either of the inputs to logic gate 15. Thus, there must be a lower bound on the observability of the output from gate 13 which is greater than or equal to the observability of either of the inputs of logic gate 15.

On the other hand, if the signal paths are completely independent and never converge between fan-out connection 19 and system outputs 12, the observability of the output from logic gate 13 in fan-out connection 19 is equal to the observabilities of each of the inputs to gate 15 less the probability of observing at both of these inputs as is known from probability theory for independent probabilities. This probability would be the maximum observability, i.e. the upper bound, which could be found for the output of logic gate 13 in fan-out connection 19 because there would be two completely independent ways of observing at system outputs 12 logic values occurring at the output of logic gate 13. Thus, an analysis of the circuit system would be required to establish the actual observability of the output of logic gate 13.

To avoid having to do such an analysis, the observability of any gate input of a logic gate which can be sensitized to more than one of the logic gate outputs is approximated by taking an arbitrary combination of these observabilities between the lower and upper bounds. Experience has shown that the combination chosen is not a particularly critical matter and an adequate combination is to combine them on the basis of the observabilities being independent of one another.

With this methodology, then, the observabilities of each gate input of the logic gates in the circuit system can be found using the above equation for $B0(i,j)$ and the assumption of independent observabilities at each logic gate output with respect to a logic gate input to find the zero-observability of a logic gate input $i$, $B0(i)$, and similarly to find $B1(i)$ using the foregoing equation for $B1(i,j)$ and again assuming independent observabilities at the outputs of logic gates. However, because of feedback connections like 21 in FIG. 2 and because of the assumption of independent observabilities at the outputs of logic gates for a given sensitization to an input gate and subsequent reconvergences, the observabilities calculated on a first attempt following the above methodology will not yield a consistent set of observabilities. Therefore, the calculation of observabilities must be repeated using the values obtained in the first calculation to yield more consistent values for the observabilities in the second calculation. This repetition of calculations, or iteration of calculations, is continued until a consistent set of gate input observabilities result. Such convergence has always been found to occur in the absence of any errors in the calculation program or in the network and logic gate representations.

Upon obtained a set of one- and zero-observabilities for each of the logic gate inputs, they, together with the zero- and one-controllabilities, permit determining the estimated fault detection probabilities for each gate input in the circuit system as indicated in FIG. 3. For a fault at gate input $i$ in which that gate input or the electrical interconnection leading to it, such that it appears to be stuck at a logic value of one requires, for detection at system outputs 12, that line $i$ have the opposite logic value of a zero provided for it and that line $i$ with such a value on it be observed at a system output 12. The probability of doing this, i.e. the probability of detecting the fault of line $i$ being stuck at logic value one, is:

$$D1(i) = B0(i)C0(i)$$

Similarly, there is a probability of detecting the opposite sort of error on gate input $i$, or the electrical interconnection leading to it, behaving as though it were stuck at a logic value of one which can be expressed as:

$$D0(i) = B1(i)C1(i)$$

Thus, $D0(i)$ and $D1(i)$ are the probabilities of detecting a "stuck at 0" or "stuck at 1", respectively, in any single provision of a set of randomly chosen logic values for system inputs 11.

However, for a test contemplated to provide N sequential sets of such randomly chosen logic values to system inputs 11, the probability of detecting a fault from the results of an entire sequence of such sets increases significantly. As is well known from probability theory, the probability of detecting a fault at gate input $i$ in N tests if the probability of doing so in each test is $D0(i)$ or $D1(i)$, is:

$$D_N 0(i) = 1 - [1 - D0(i)]^N$$

$$D_N 1(i) = 1 - [1 - D1(i)]^N$$

However, the expected value of the random variables $D_N 0(i)$ and $D_N 1(i)$ from test-based sampling can be shown to be biased away from the actual mean values for these variables so that substituting a sample means value for $D0(i)$ or $D1(i)$ leads to a biased estimate of the probability of detecting a fault in N tests. A reasonable improvemehnt in the values for $D_N 0(i)$ and $D_N 1(i)$ can be achieved by placing a factor of $1/W$ multiplying the quantity raised to the power of N where W is:

$$W = 1 + \frac{N-1}{6} \times B^2 \times \frac{D}{1-D}$$

where a value of 5.478 for B provides a reasonable result. The value for B is not critical if N is sufficiently large and the design has been altered, if need be, so that the fault detection probabilities $D0(i)$ and $D1(i)$ are sufficiently large.

As a result of this analysis, each gate input in the circuit system representation can be listed showing its fault detection probability as a result of providing N sets of randomly chosen logic values to system inputs 11. Of course, those gate inputs which have a fixed logic value applied to them as part of the design will not need to be covered. If any of the gate inputs are found to have fault detection probabilities of zero or some extremely low value, the initial or proposed design for the circuit system is reviewed and alterations made as indicated in FIG. 3 to provide a subsequent design having better fault detection capabilities for those input gates which had low fault detection probabilities in the initial design. This subsequent design can then be evaluated again in the manner just described for its testability and further changes can be made in yet another design as needed, based on finding any zero or very low fault detection probabilities for the design subsequent to the initial design. Once a satisfactory design has been established, a monolithic integrated circuit can be fabricated embodying this design. Although the present invention has been described with reference to preferred embodiments, workers skilled in the art will recognize that changes may be made in form and detail without departing from the spirit and scope of the invention.

What is claimed is:

1. A method for designing a circuit system comprising a plurality of logic gates each having a gate input and a gate output with said circuit system having a plurality of system inputs and outputs, said logic gates to be electrically interconnected together at said gate inputs and outputs and to said system inputs and outputs in a selected manner, said method comprising:

representing an initial design for said circuit system in a computer system which is capable of determining for this initial design so represented those logic values that will occur at said logic gate outputs in response to selected logic values being provided at said circuit system inputs in said initial design representation;

providing a plurality of controllability count registers in said computer system for each of said gate inputs in said initial design representation with each such count register being capable of keeping a total of count increments provided thereto in said computer system, there being a said controllability count register in each said plurality of controllability count registers for each of those logic values which can occur at that said gate input corresponding thereto;

providing a plurality of sensitivity count registers in said computer system for each pairing possible of said gate inputs and outputs in each of said logic gates in said initial design representation with each such count register being capable of keeping a total of count increments provided thereto in said computer system, there being a said sensitivity count register in each said plurality of sensitivity count registers for each gate input and output logic value pair which can occur at that gate input and output pair corresponding thereto;

providing in sequence a plurality of sets of logic values in said computer system for said circuit system inputs in said initial design representation;

determining in said computer system those logic values that will occur at said logic gate outputs in said initial design representation in response to each set of logic values provided at said circuit system inputs in said initial design representation, as aforesaid;

incrementing each said controllability count register by one count if a logic value corresponding thereto appears at its corresponding gate input after each said determining of logic values;

incrementing each sensitivity count register by one count if a pair of gate input and output logic values corresponding thereto appears at its corresponding gate input and output pair after each said determining of logic values, but only if gate input logic values occurring at those other said gate inputs of said corresponding logic gate are such that were a change to occur in that gate input logic value of such an appearing pair of gate input and output logic values that there would result a change in that gate output logic value of such appearing pair; and estimating what likelihoood exists in such initial design for detecting at some said circuit system output an incorrect logic value occurring at any logic gate input based on total counts occurring in each said controllability count register and in each said sensitivity count register after said plurality of sets of logic values has been provided for said circuit system inputs in said initial design representation, as aforesaid.

2. The method of claim 1 wherein those logic values in each said set of logic values provided for said circuit system inputs in said initial design representation by said computer system are formed from logic values generated through use of a process which provides a sufficient randomness in such logic values in said set to provide said likelihood estimates of sufficient accuracy.

3. The method of claim 1 wherein said estimating proceeds by estimating a first logic value observability and a second logic value observability for said gate inputs of each said logic gate in said initial design representation, said first logic value observability of a said gate input being that probability of having a first logic value presented on such a gate input and causing a change in a logic value occurring on some said circuit system output, and said second logic value observability of a said gate input being that probability of having a second logic value presented on such a gate input and causing a change in logic value occurring on some said circuit system output.

4. The method of claim 3 wherein a first logic value detection likelihood at a circuit system output of an incorrect second logic value occurring on a said gate input after a set of logic values has been provided on said circuit system inputs is estimated by multiplying said estimated second logic value observability for that said gate input in said initial design representation by said count total occurring in said controllability count register corresponding to that said gate input and to said second logic value occurring at that said gate input divided by that number of said sets occurring in said sequence, and wherein a second logic value detection likelihood at a circuit system output of an incorrect second logic value occurring on a said gate input after a set of logic values has been provided on said circuit system inputs is estimated by multiplying said estimated first logic value observability for that said gate input in said initial design representation by said count total occurring in said controllability count register corresponding to that said gate input and to said first logic value occurring at that said gate input divided by that number of said sets occurring in said sequence.

5. The method of claim 4 wherein a test sequence first logic value likelihood detection at a circuit system output of an incorrect first logic value occurring on a said gate input as a result of plural sets of logic values having been provided on said circuit system inputs is estimated by subtracting from one a quantity multiplied by a selected constant equal to said first logic value detection likelihood subtracted from one raised to a power equal to that number of said plural sets of logic values, and wherein a test sequence second logic value likelihood detection at a circuit system output of an incorrect second logic value occurring on a said gate input as a result of a plural sets of logic values having been provided on said circuit system inputs is estimated by subtracting from one a quantity multiplied by a selected constant equal to said second logic value detection likelihood subtracted from one raised to a power equal to that number of said plural sets of logic values.

6. The method of claim 4 wherein said first logic value observability of a said input gate is estimated by combining selectively for each said gate output in that said logic gate paired as aforesaid with that said gate input that value determined by (a) that count total in said sensitivity count register corresponding to that said gate input and a paired said gate output, where each have said first logic value thereat, and multiplied by said first logic value observability of that paired said gate output as set by said first logic value observabilities of each gate input of other said logic gates connected to that paired said gate output, plus (b) that count total in said sensitivity count register corresponding to that said gate input and said paired gate ouput, where that gate input has said first logic value thereat and that paired said gate output has said second logic value thereat, and multiplied by said second logic value observability of that paired said gate output as set by said second logic value observabilities of each gate input of other said logic gates connected to that paired said gate output, all divided by (c) that count total occurring in said controllability count register corresponding to that said gate input for said first logic value occurring thereat.

7. The method of claim 4 wherein said second logic value observability of a said input gate is estimated by combining selectively for each said gate output in that said logic gate paired as aforesaid with that said gate input that value determined by (a) that count total in said sensitivity count register corresponding to that said gate input and said paired gate output, where the gate input has said second logic value thereat and that paired said gate output has said first logic value thereat, and multiplied by said first logic value observability of that paired said gate output as set by said first logic value observabilities of each gate input of other said logic gates connected to that paired said gate output, plus (b) that count total in said sensitivity count register corresponding to that said gate input and a paired said gate output, where each have said second logic value thereat, and multiplied by said second logic value observability of that paired said gate output as set by said second logic value observabilities of each gate input of other said logic gates connected to that paired said gate output, all divided by (c) that count total occurring in said controllability count register corresponding to that said gate input for said second logic value occurring thereat.

8. The method of claim 1 wherein said estimating is followed by altering said initial design to form a subsequent design to increase at least some of said likelihood estimations.

9. The method of claim 8 wherein said representing of said initial design has representing of said subsequent design substituted therefor and those steps set forth in claim 1 are repeated.

10. The method of claim 9 wherein an integrated circuit structure is fabricated having substantially said subsequent design embodied therein.

11. The method of claim 9 wherein said subsequent design is allowed to form a further subsequent design to increase at least some of its likelihood estimations, and wherein said representing of said subsequent design has representations of said further subsequent design substituted therefor and those steps set forth in claim 1 are repeated.

12. The method of claim 11 wherein an integrated circuit structure is fabricated having substantially said further subsequent design embodied therein.

* * * * *